(12) United States Patent
Chiu et al.

(10) Patent No.: US 12,713,594 B2
(45) Date of Patent: Aug. 18, 2026

(54) SEMICONDUCTOR STRUCTURE AND METHOD FOR FORMING THE SAME

(71) Applicant: Winbond Electronics Corp., Taichung City (TW)

(72) Inventors: Yung-Han Chiu, Taichung City (TW); Shu-Ming Li, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 507 days.

(21) Appl. No.: 18/187,383

(22) Filed: Mar. 21, 2023

(65) Prior Publication Data

US 2023/0309297 A1 Sep. 28, 2023

(30) Foreign Application Priority Data

Mar. 22, 2022 (TW) ................................. 111110486

(51) Int. Cl.
*H10B 41/30* (2023.01)
*H10D 30/68* (2025.01)

(52) U.S. Cl.
CPC ......... *H10B 41/30* (2023.02); *H10D 30/6891* (2025.01)

(58) Field of Classification Search
None
See application file for complete search history.

(56) References Cited

U.S. PATENT DOCUMENTS

2002/0055217 A1* 5/2002 Kanamori ......... H01L 21/76202 438/296
2003/0013272 A1* 1/2003 Hong ................ H01L 21/76224 257/E21.546
2005/0275063 A1* 12/2005 Sumino ............ H01L 21/76235 257/E21.549
2021/0134980 A1 5/2021 Lee et al.
2023/0067170 A1 3/2023 Yao et al.

FOREIGN PATENT DOCUMENTS

CN 112635470 A 4/2021
CN 114080684 A 2/2022
TW I700744 B 8/2020
TW 202141799 A 11/2021

* cited by examiner

*Primary Examiner* — Xiaoming Liu
(74) *Attorney, Agent, or Firm* — MUNCY, GEISSLER, OLDS & LOWE, P.C.

(57) ABSTRACT

A semiconductor structure includes an active region of a substrate, a gate electrode layer disposed over the active region, an isolation structure surrounding the active region and the gate electrode layer, and a gate dielectric layer. The gate dielectric layer includes a first portion interposed between the bottom surface of the gate electrode layer and the top surface of the active region. The gate dielectric layer also includes a second portion interposed between the isolation structure and the sidewall of the active region.

10 Claims, 6 Drawing Sheets

100
138
130 132 136 134
A
147
144
102
102A
102A
102A
102A
102A

SEMICONDUCTOR STRUCTURE AND METHOD FOR FORMING THE SAME

CROSS REFERENCE TO RELATED APPLICATIONS

This application claims the benefit of Taiwan Patent Application No. 111110486 filed on Mar. 22, 2022, entitled "SEMICONDUCTOR STRUCTURE AND METHOD FOR FORMING THE SAME" which is hereby incorporated herein by reference.

BACKGROUND

Field of the Disclosure

The present disclosure relates to a semiconductor structure, and in particular, it relates to a flash memory.

Description of the Related Art

Over the past few years, flash memory has become popular as a nonvolatile memory device. Its advantages include high density, low cost, and being rewritable and electrically erasable. Also, flash memory is commonly used in various portable electronic products such as notebook computers, MP3 players, digital cameras, mobile phones, and game consoles. With the shrinkage of the memory manufacturing processes, general manufacturing processes of flash memory have the following problems. Therefore, how to provide a method for forming a flash memory is an important issue.

SUMMARY

In some embodiments of the disclosure, a semiconductor structure is provided. The semiconductor structure includes an active region of a substrate, a gate electrode layer disposed over the active region, an isolation structure surrounding the active region and the gate electrode layer, and a gate dielectric layer. The gate dielectric layer includes a first portion and a second portion. The first portion is interposed between the bottom surface of the gate electrode layer and the top surface of the active region. The second portion is interposed between the isolation structure and the sidewall of the active region.

In some embodiments of the disclosure, a method for forming a semiconductor structure is provided. The method includes etching a semiconductor substrate using a sacrificial pattern to define an active region of the semiconductor substrate, forming a first lining layer along a sidewall of the active region, forming a first insulating material to surround the active region, removing the sacrificial pattern, etching the first lining layer to form a recess between the first insulating material and the active region, forming a gate dielectric layer over the active region and filling the recess, and forming a gate electrode layer over the gate dielectric layer.

BRIEF DESCRIPTION OF THE DRAWINGS

The present disclosure can be further understood by reading the subsequent detailed description and examples with references made to the accompanying drawings, wherein:

FIG. 1J-1 illustrates a portion "A" in FIG. 1J to illustrate additional details in accordance with some embodiments of the present disclosure.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 1A:
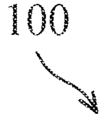
FIGS. 1A-1J illustrate cross-sectional views of forming a semiconductor structure at various stages in accordance with some embodiments of the present disclosure.
Figure 1A:
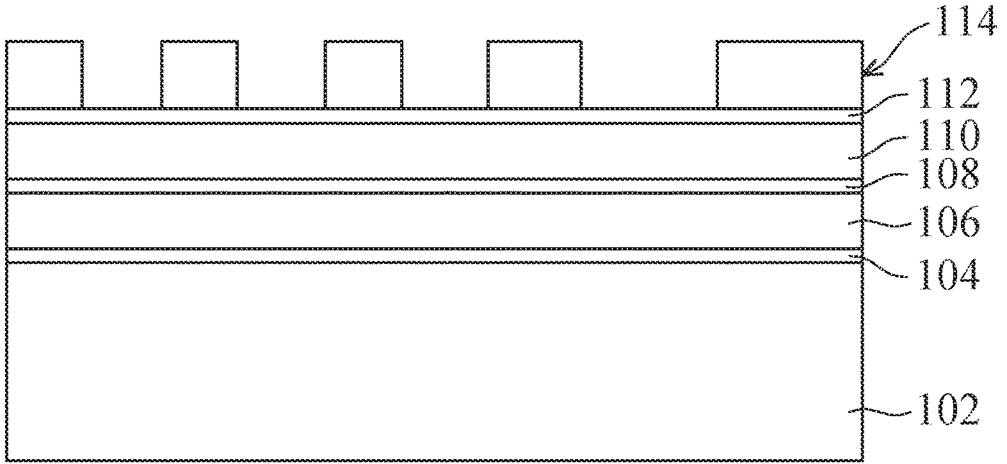

FIGS. 1A-1L illustrate cross-sectional views of forming a semiconductor structure at various stages in accordance with some embodiments of the present disclosure. A semiconductor structure 100 is provided, as shown in FIG. 1A. The semiconductor structure 100 includes a semiconductor structure 102. The semiconductor substrate 102 is an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

A pad oxide layer 104, a sacrificial layer 106, a hard mask layer 108, a hard mask layer 110 and an anti-reflective layer 112 are sequentially formed over the semiconductor substrate 102. The sacrificial layer 106 and the hard mask layer 110 are made of a carbon-rich material such as carbon, amorphous carbon, spin-on coating carbon (SOC), or a combination thereof. The hard mask layer 108 and the anti-reflective layer 112 are made of silicon-rich material, such as a silicon-containing bottom anti-reflective coating (Si-BARC) layer, a silicon oxynitride (SiON) layer, or a combination thereof. The sacrificial layer 106 is a carbon layer; the hard mask layer 108 is a silicon oxynitride (SiON) layer; the hard mask layer 110 is a SOC layer; and the anti-reflective layer 112 is a Si-BARC layer.

Figure 1B:
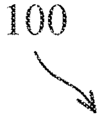
Figure 1B:
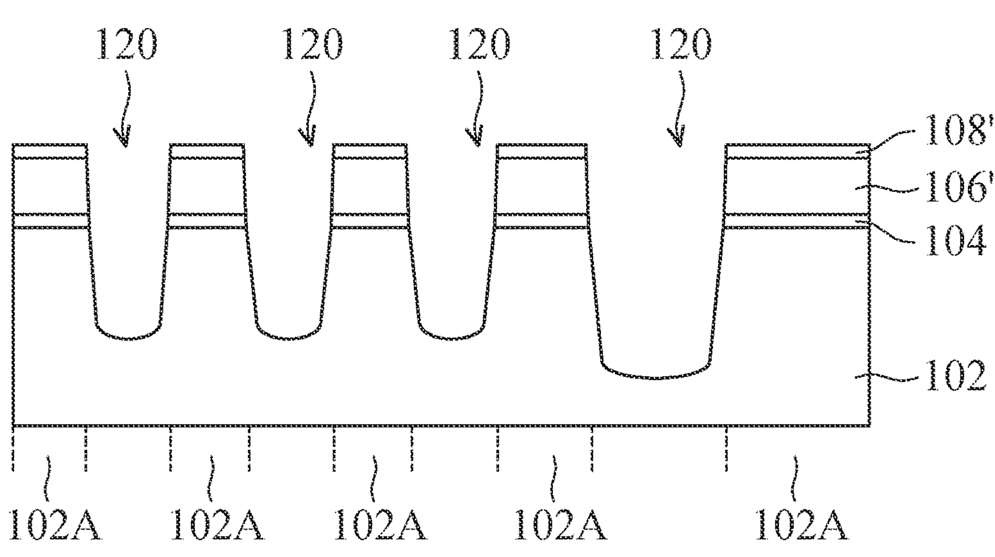

A patterning process is performed on the semiconductor structure 100. The patterning process includes forming photoresist patterns 114 over the anti-reflective layer 112 using a photolithography process, as shown in FIG. 1A. The patterning process includes performing an etching process on the semiconductor structure 100 using the photoresist patterns 114. The etching process may include multiple etching steps for various material layers. For example, as shown in FIG. 1B, a first etching step is performed on the semiconductor structure 100 to sequentially etch portions of the anti-reflective layer 112, the hard mask layer 110, the hard mask layer 108 and the sacrificial layer 106 uncovered by the photoresist patterns 114. The first etching step transfers the photoresist patterns 114 into the anti-reflective layer 112, the hard mask layer 110, the hard mask layer 108 and the sacrificial layer 106. During the first etching step, the photoresist patterns 114 and the anti-reflective layer 112 are entirely consumed. The patterned hard mask layer 108 are denoted as hard mask patterns 108'.

Next, a second etching step is performed on the semiconductor structure 100 to sequentially remove portions of the pad oxide layer 104 and the semiconductor substrate 102 uncovered by the hard mask patterns 108', thereby forming trenches 120 which define the active regions 102A of the substrate 102. During the second etching step, the hard mask layer 110 is entirely consumed. The patterned sacrificial layer 106 is denoted as sacrificial patterns 106'. Due to the characteristics of the etching process, the sacrificial patterns 106' have profiles that taper upward. That is, the upper surfaces of the sacrificial patterns 106' are narrower than the bottom surfaces of the sacrificial patterns 106'.

Figure 1C:
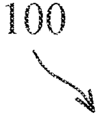
Figure 1C:
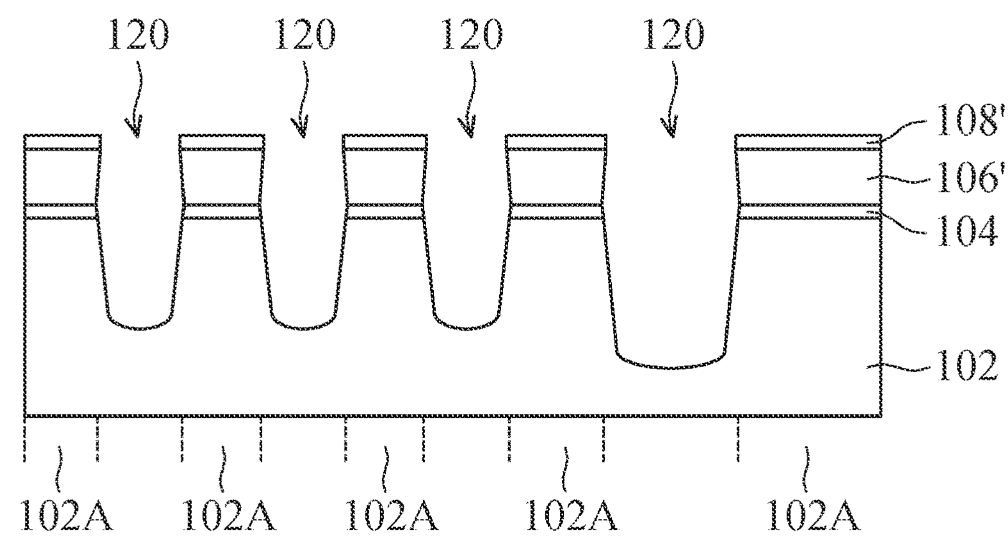

Optionally, a third etching steps are performed on the semiconductor structure 100 to trim the sacrificial patterns 106', as shown in FIG. 1C. During the third etching step, the sacrificial patterns 106' are laterally etched. The etching amount at the bottom surfaces of the sacrificial patterns 106' may be greater than the etching amount at the upper surfaces of the sacrificial patterns 106', so that the trimmed sacrificial patterns 106' have profiles that taper downward. That is, the upper surfaces of the sacrificial patterns 106' are wider than the bottom surfaces of the sacrificial patterns 106'.

Figure 1D:
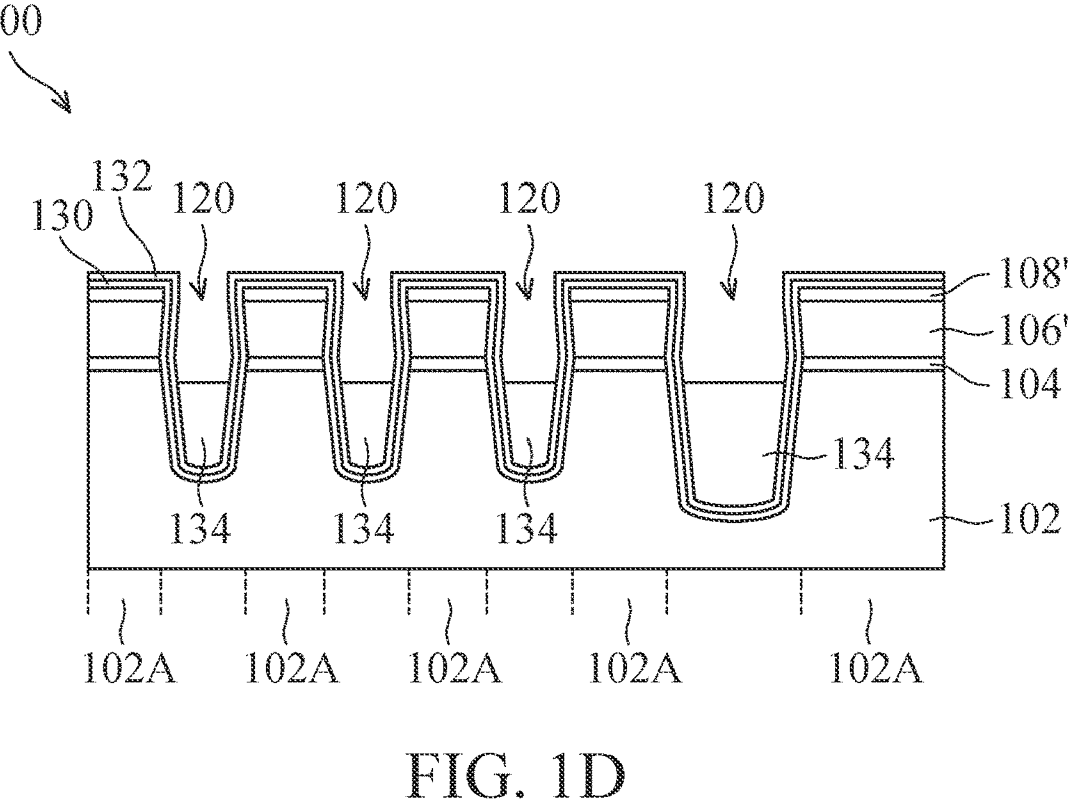

A lining layer 130, a lining layer 132 and an insulating material 134 are sequentially formed over the semiconductor structure 100, as shown in FIG. 1D. The lining layer 130 and the lining layer 132 partially fill the trenches 120, and the insulating material 134 overfills the remainder of the trenches 120. The lining layer 130 is made of oxide such as silicon oxide (SiO). The lining layer 132 is made of nitride such as silicon nitride (SiN). The lining layer 130 and the lining layer 132 are formed using a chemical vapor deposition (CVD) process, an atomic layer deposition (ALD) process, or another suitable technique.

The insulating material 134 is made of silicon oxide, silicon nitride, silicon oxynitride, or a combination thereof. In some embodiments, the insulating material 134 is spin-on-glass (SOG), which is deposited using a spin-on coating process. The SOG is then planarized using an anneal process. Afterward, a portion of the insulating material 134 over the upper surface of the lining layer 132 is removed by a process such as chemical mechanical polishing (CMP) until the lining layer 132 is exposed. The insulating material 134 is recessed using dry etching or wet etching to form trenches 122, as shown in FIG. 1D. The top surface of the insulating material 134 is below the upper surfaces of the active regions 102A.

Figure 1E:
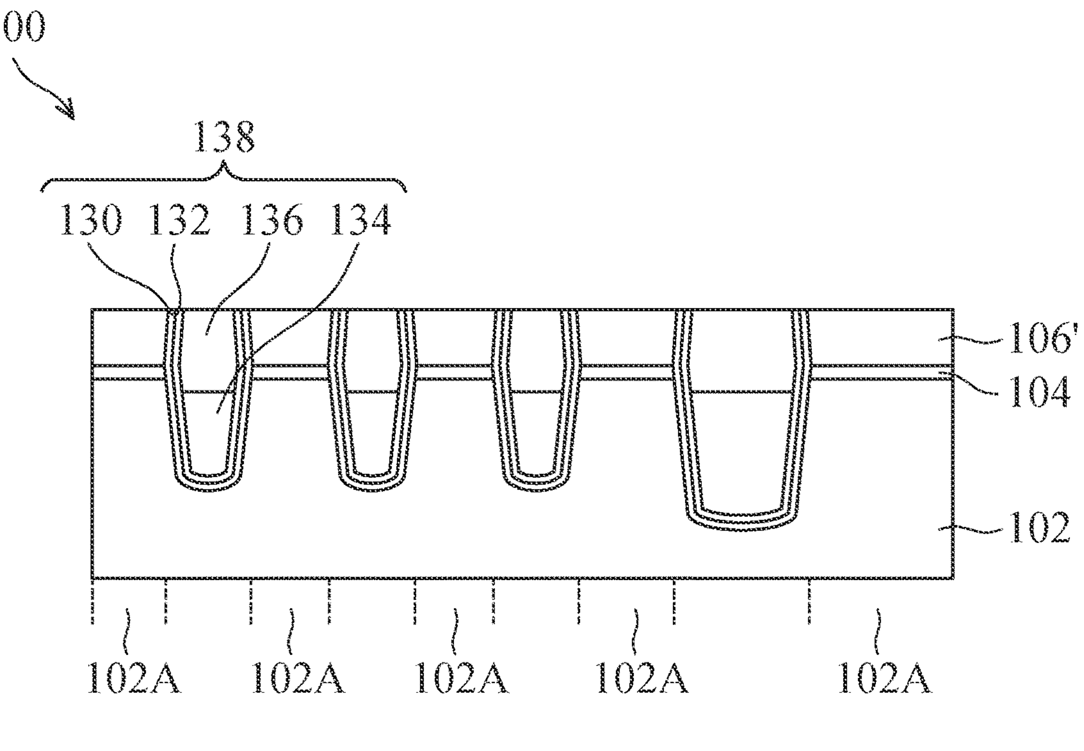

An insulating material 136 is formed over the semiconductor structure 100 to fill the trenches 122, as shown in FIG. 1E. The insulating material 136 is made of silicon oxide, silicon nitride, silicon oxynitride, or a combination thereof. In some embodiments, the insulating material 136 is formed using a high-density plasma CVD (HDP-CVD) process. Afterward, a portion of the insulating material 136 over the upper surface of the lining layer 132 is removed using a process such as CMP until the lining layer 132 is exposed.

An etching-back process is then performed on the semiconductor structure 100. The etching-back process removes the lining layer 132, the lining layer 130 and the hard mask patterns 108' over the sacrificial patterns 106' until the sacrificial patterns 106' are exposed, as shown in FIG. 1E. The remaining portions of lining layer 130, the lining layer 132, the insulating material 134 and the insulating material 136 combine to form an isolation structure 138. The isolation structure 138 surrounds the active regions 102A, the pad oxide layer 104 and the sacrificial patterns 106'.

Figure 1F:
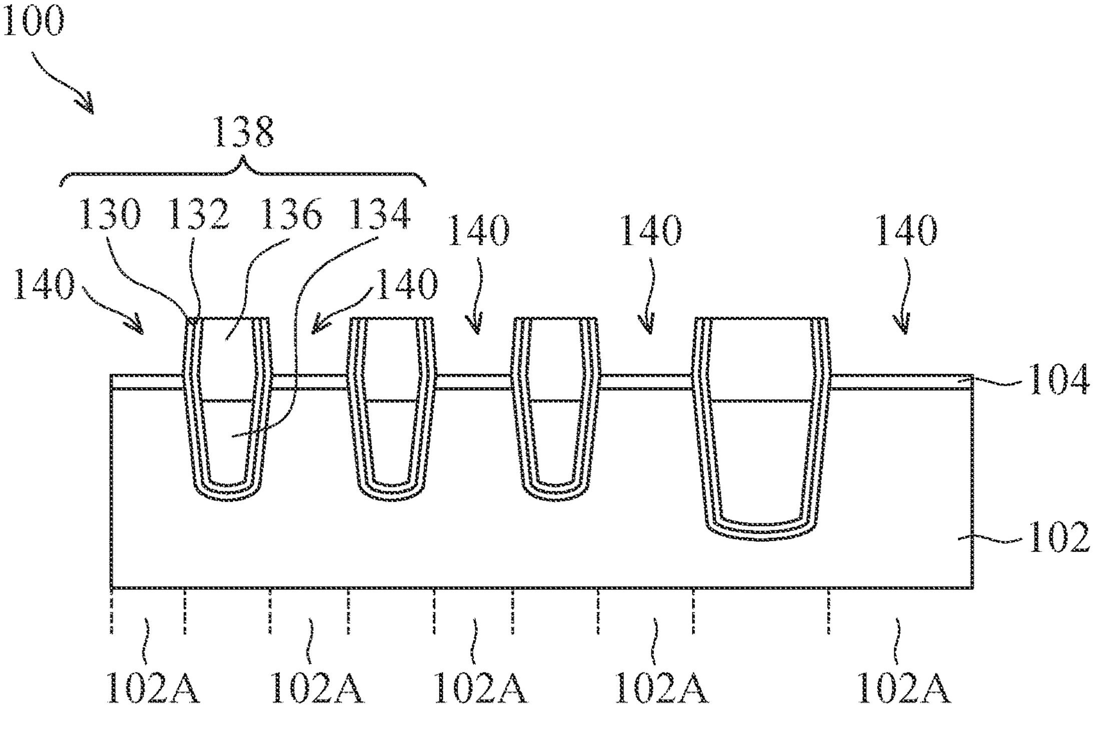

The sacrificial patterns 106' are removed to form openings 140, as shown in FIG. 1F, in accordance with some embodiments. The openings 140 expose the pad oxide layer 104 and the lining layer 130 of the isolation structure 138. The removal process includes an ashing process or an etching process.

Figure 1G:
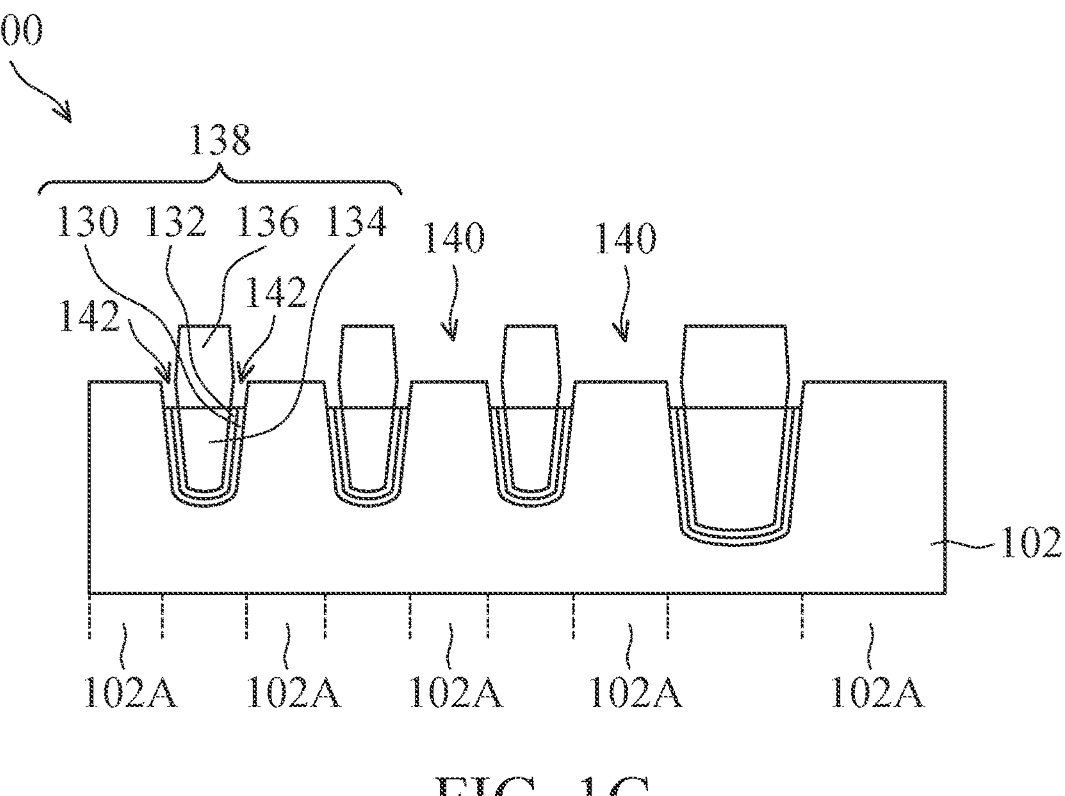

After the sacrificial patterns 106' are removed, a clean process is performed on the semiconductor structure 100 to remove the pad oxide layer 104 and expose the upper surfaces of the active regions 104, as shown in FIG. 1G. The clean process may use dilute hydrofluoric acid.

Next, an etching process is performed on the semiconductor structure 100 to recess the lining layer 130 and the lining layer 132 of the isolation structure 138, thereby forming recesses 142 between the active regions 102A and the isolation material 136, as shown in FIG. 1G. The recesses 142 expose the sidewalls of the active regions 102A and the sidewalls of the insulating material 136 of the isolation structure 138. In some embodiments, the etching process may use hot phosphoric acid ($H_3PO_4$). In some embodiments, the bottom surfaces of the recesses 142 are located not lower than the interface between the insulating material 136 and the insulating material 134.

Figure 1H:
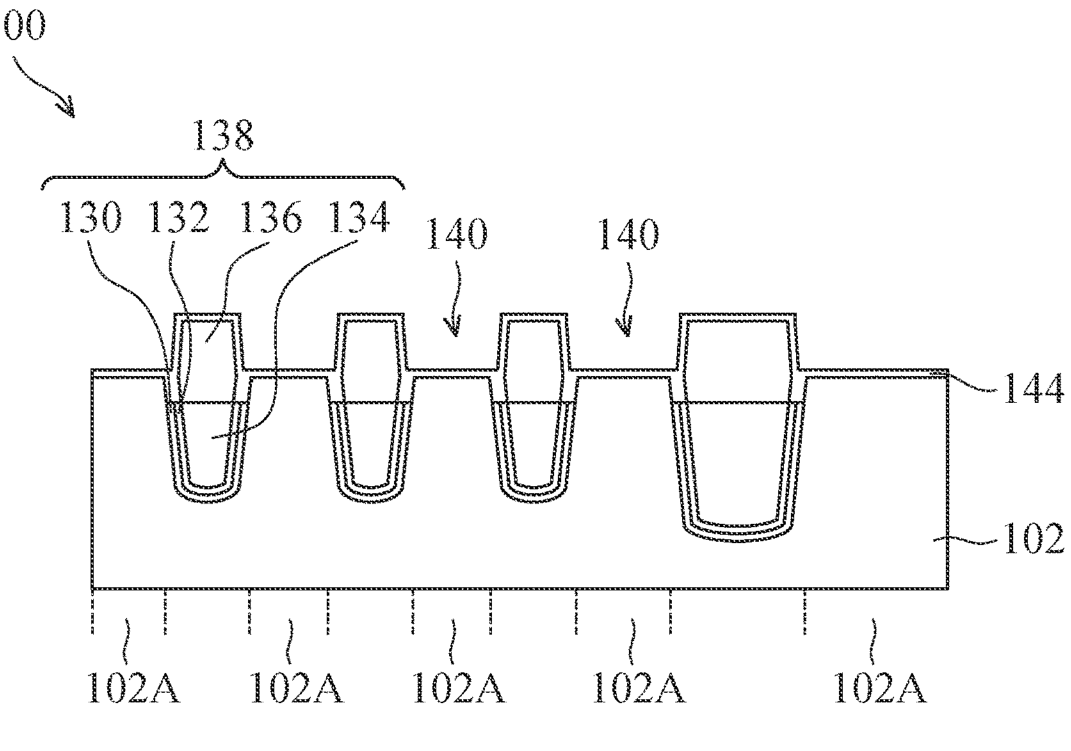

A gate dielectric layer 144 is formed over the semiconductor structure 100 to fill the recesses 142 and extends along the upper surfaces of the active regions 102A and the sidewalls and the upper surface of the insulating material 136, as shown in FIG. 1H. The gate dielectric layer 144 is made of silicon oxide, silicon oxynitride, silicon nitride, or another suitable dielectric material. The gate dielectric layer 144 is formed using CVD, ALD, or another suitable technology.

Figures 1I, 1J:
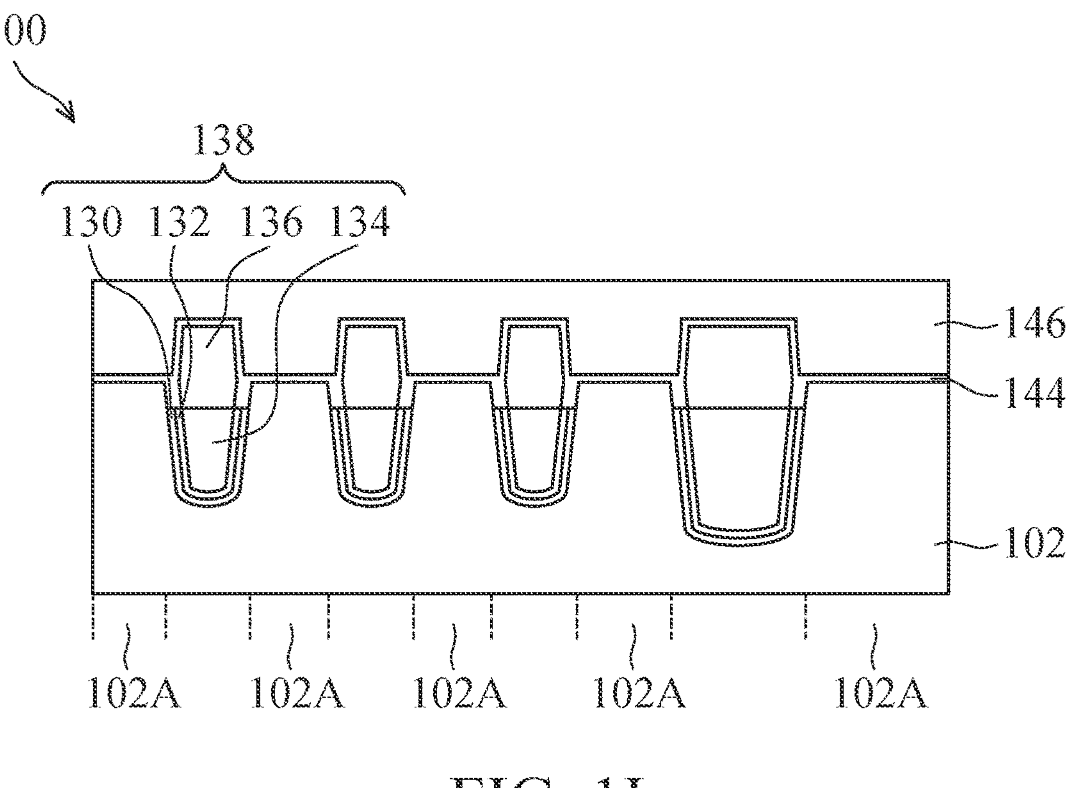

A conductive material 146 is formed over the gate dielectric layer 144 to overfill the recesses 142, as shown in FIG. 1I. The conductive material 146 is made of polysilicon, metal or metal nitride. The polysilicon may be doped, e.g., with p-type or n-type dopants. In some embodiments, the metal may be tungsten (W), titanium (Ti), aluminum (Al), copper (Cu), molybdenum (Mo), nickel (Ni), platinum (Pt), or another suitable material. In some embodiments, the conductive material 146 is formed using a CVD process or a physical vapor deposition (PVD) process. The sacrificial patterns 106' have profiles that taper downward, which may help in reducing the likelihood of the formation of voids inside the conductive material 146.

A planarization process is performed on the conductive material 146 to remove a portion of the conductive material 146 over the isolation structure 138 until the isolation structure 138 is exposed, as shown in FIG. 1J. The planarization process may be a CMP process or an etching-back process. A remainder of the conductive material 146 in the openings 140 serves as the gate electrode layers 147. The gate electrode layers 147 and the gate dielectric layers 144 combine to form the gate structures of a semiconductor device. The gate electrode layers 147 have profiles that taper downward. That is, the upper surfaces of the gate electrode layers 147 are wider than the bottom surfaces of the gate electrode layers 147. In addition, the bottom surfaces of the gate electrode layers 147 meet with the sidewalls of the gate electrode layers 147 with obtuse angles.

In some embodiments, additional components may be formed over the semiconductor structure 100 to produce a semiconductor memory device such as a flash memory device. In some embodiments, the gate dielectric layer 144 may serve as the tunnel oxide layer of the flash memory device, and the gate electrode layer 147 may serve as the floating gate of the flash memory device.

Figures 1, 1J:
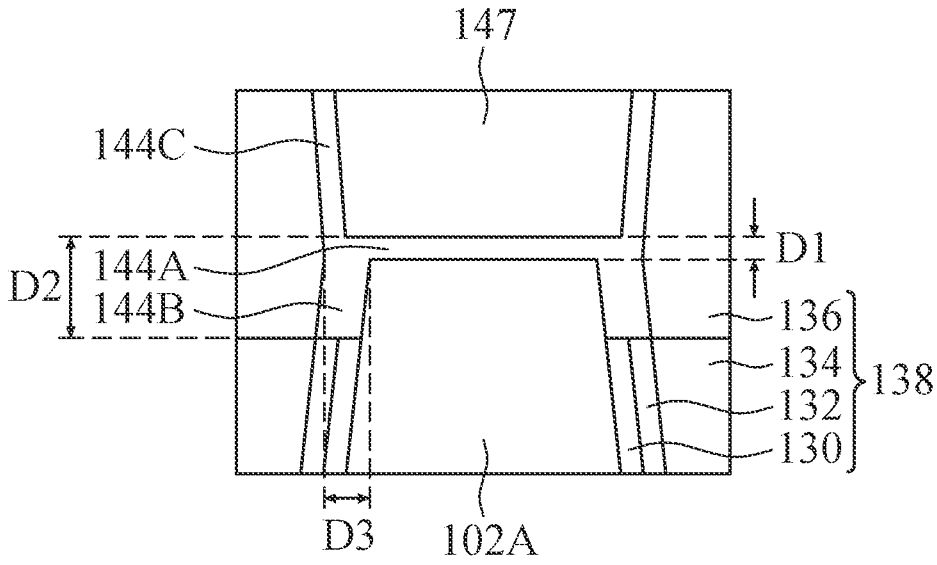

FIG. 1J-1 illustrates a portion “A” in FIG. 1J to illustrate additional details in accordance with some embodiments of the present disclosure. The gate dielectric layer 144 includes a first portion 144A, a second portion 144B, and a third portion 144C. The first portion 144A is interposed between the bottom surface of the gate electrode layer 147 and the top surface of the active region 102A. The second portion 144B is interposed between the insulating material 136 of the isolation structure 138 and the sidewall of the active region 102A. The third portion 144C is interposed between the insulating material 136 of the isolation structure 138 and the sidewall of the gate electrode layer 147. The first portion 144A of the gate dielectric layer 144 has a thickness D1 in the vertical direction, and the second portion 144B of the gate dielectric layer 144 has a thickness D2 in the vertical direction. The thickness D2 is greater than the thickness D1. In addition, the second portion 144B of the gate dielectric layer 144 has a width D3 in the lateral direction. The width D3 is greater than the thickness D1.

In accordance with the embodiments of the present disclosure, by forming the recesses 142 (FIG. 1I), the stress generated at the intersection of the top surface of the active region 102A and the sidewall of the isolation structure 138 can be mitigated. In cases in which the recesses 142 is not formed, the stress may be concentrated on the intersection of the top surface of the active region 102A and the sidewall of the isolation structure 138, which may result in the gate dielectric layer 144 being thinner at the edge of the active region 102A. As such, the reliability of the semiconductor device may be negatively affected. Therefore, the embodiments utilize the formation of the recesses 142 to reduce the concentration of stress, thereby addressing the problem of the gate dielectric layer 144 being thinner at the edge of the active region 102A. As a result, the reliability of the semiconductor device may be improved.

Figure 2:
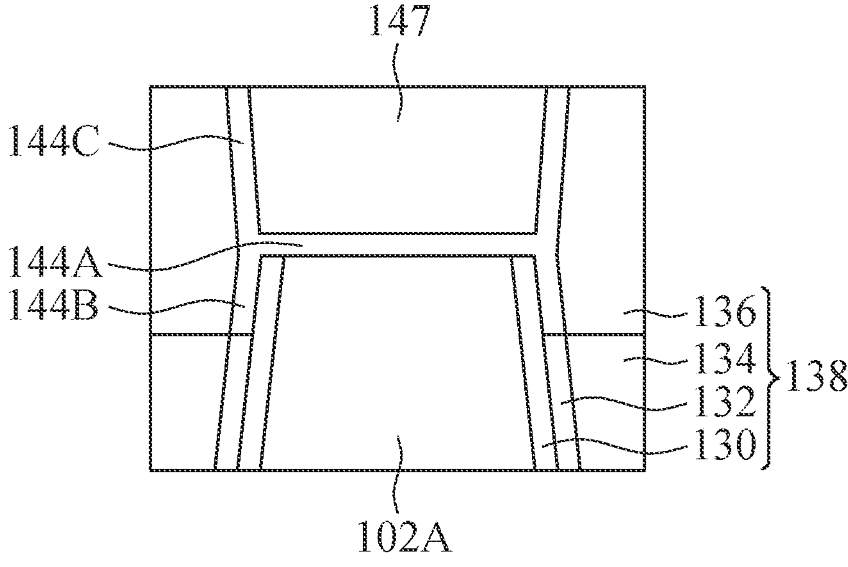
FIG. 2 is a modification of FIG. 1J-1 in accordance with some embodiments of the present disclosure.

FIG. 2 is a modification of FIG. 1J-1 in accordance with some embodiments of the present disclosure. During the etching process described above in FIG. 1G, an etching selectivity may present between the lining layer 130 and the lining layer 132, in accordance with some embodiments. Therefore, the lining layer 132 may be recessed while the lining layer 130 may remain substantially unetched. The recess 142 is formed between the lining layer 130 and the insulating material 136 of the isolation structure 138, and the second portion 144B of the gate dielectric layer 144 is formed in the recess 142.

As described above, the embodiments of the present disclosure provide a method for forming a semiconductor structure. By recessing the lining layer of the isolation structure, the concentration of stress at the intersection of the active region and the isolation structure can be mitigated. As a result, the thickness of the gate dielectric layer may keep consistent at the edge of the active area and at the center of the active area. Therefore, the reliability of the semiconductor device may be improved.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:

an active region over a substrate;

a gate electrode layer disposed over the active region;

an isolation structure surrounding the active region and the gate electrode layer; and a gate dielectric layer comprising a first portion interposed between a bottom surface of the gate electrode layer and a top surface of the active region, wherein the active region has an outermost sidewall that extends continuously downward from an end of the top surface of the active region to a top surface of the substrate, and the gate dielectric layer further comprises a second portion interposed between the isolation structure and the outermost sidewall of the active region.

2. The semiconductor structure as claimed in claim 1, wherein the gate dielectric layer further comprises a third portion interposed between the isolation structure and a sidewall of the gate electrode layer.

3. The semiconductor structure as claimed in claim 1, wherein the isolation structure comprises a first insulating material and a first lining layer lining between the first insulating material and the outermost sidewall of the active region, and a top surface of the first lining layer is located lower than the top surface of the active region.

4. The semiconductor structure as claimed in claim 3, wherein the second portion of the gate dielectric layer partially abuts the first lining layer of the isolation structure.

5. The semiconductor structure as claimed in claim 3, wherein the first lining layer of the isolation structure extends between the second portion of the gate dielectric layer and the outermost sidewall of the active region.

6. The semiconductor structure as claimed in claim 3, wherein the isolation structure further comprises a second lining layer lining between the first insulating material and the first lining layer, the second lining layer and the first lining layer are made of different materials, and the second portion of the gate dielectric layer partially abuts the second lining layer of the isolation structure.

7. The semiconductor structure as claimed in claim 3, wherein the isolation structure further comprises a second insulating material disposed over the first insulating material, wherein the second portion of the gate dielectric layer has a bottom surface that is located not lower than an interface between the second insulating material and the first insulating material.

8. The semiconductor structure as claimed in claim 1, wherein the bottom surface of the gate electrode layer meets with a sidewall of the gate electrode layer at an obtuse angle.

9. The semiconductor structure as claimed in claim 1, wherein a thickness of the first portion of the gate dielectric layer is less than a width of the second portion of the gate dielectric layer.

10. The semiconductor structure as claimed in claim 1, wherein the gate dielectric layer is configured as a tunnel oxide layer of a flash memory, and the gate electrode layer is configured as a floating gate of the flash memory.

* * * * *